(12) United States Patent
Koyanagi et al.

(10) Patent No.: US 6,590,538 B1
(45) Date of Patent: Jul. 8, 2003

(54) ANTENNA APPARATUS

(75) Inventors: Yoshio Koyanagi, Ebina (JP); Genji Hirokawa, Yokohama (JP); Koichi Ogawa, Hirakata (JP); Koichi Ito, Chiba (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/812,804

(22) Filed: Mar. 20, 2001

(30) Foreign Application Priority Data

Mar. 22, 2000 (JP) ........................ 2000-080552

(51) Int. Cl.[7] .............................................. H01Q 1/24
(52) U.S. Cl. ........................................ 343/702; 343/860
(58) Field of Search ................................ 343/702, 850, 343/860, 895, 900

(56) References Cited

U.S. PATENT DOCUMENTS

| | | | |
|---|---|---|---|
| 4,571,595 A | 2/1986 | Phillips et al. | 343/745 |
| 5,335,368 A * | 8/1994 | Tamura | 455/90 |
| 5,589,844 A * | 12/1996 | Belcher et al. | 343/860 |
| 5,754,141 A * | 5/1998 | Thompson et al. | 343/702 |
| 5,801,662 A * | 9/1998 | Itoh | 343/702 |
| 5,867,127 A * | 2/1999 | Black et al. | 343/702 |
| 5,940,040 A * | 8/1999 | Koyanagi et al. | 343/702 |
| 5,991,608 A * | 11/1999 | Leyten | 455/121 |
| 6,147,651 A * | 11/2000 | Yamazaki et al. | 343/702 |
| 6,211,826 B1 * | 4/2001 | Aoki | 343/702 |
| 6,246,373 B1 * | 6/2001 | Aoki | 343/702 |
| 6,339,711 B1 * | 1/2002 | Otaka et al. | 455/550 |

FOREIGN PATENT DOCUMENTS

| | | |
|---|---|---|
| EP | 0 210 746 A2 | 6/1986 |
| GB | 2 289 989 A | 6/1995 |
| GB | 2 330 965 A | 5/1999 |
| GB | 2 355 341 A | 4/2001 |

OTHER PUBLICATIONS

Farmer, Jim, "Return Loss: An Old Problem that Still Haunts Us." Communications Technology International, Nov. 15, 2001, BIGPIPE.com: International: Archives, www.cabletoday.com/ic2/archives/1100/042_returnloss.htm.

* cited by examiner

*Primary Examiner*—Don Wong
*Assistant Examiner*—Shih-Chao Chen
(74) *Attorney, Agent, or Firm*—Pearne & Gordon LLP

(57) ABSTRACT

An antenna apparatus which has an antenna element (102) being mounted on a portable radio for receiving electric power from a feeding point (103) in the portable radio and matching in a predetermined frequency band and a matching circuit (104) for matching the impedance of the antenna element (102) and the internal impedance of the radio circuit (105). The matching circuit (104) has a match characteristic to conjugately match the internal impedance of the radio circuit (105) and the input impedance of the matching circuit (104).

8 Claims, 12 Drawing Sheets

FIG. 2
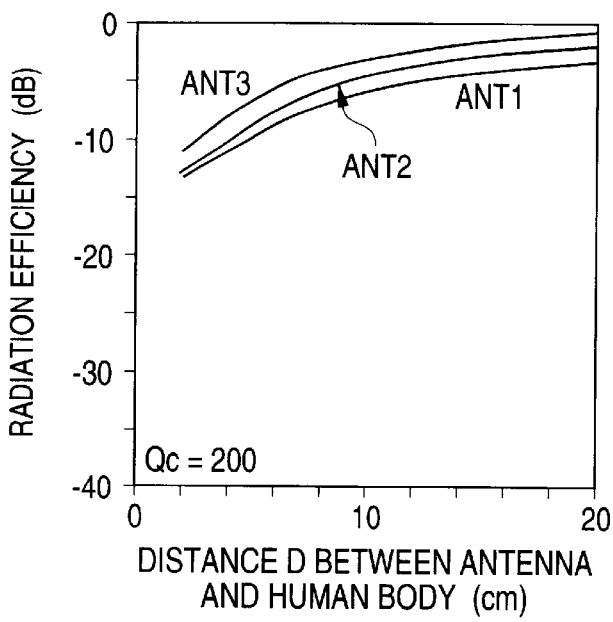
FIG. 3
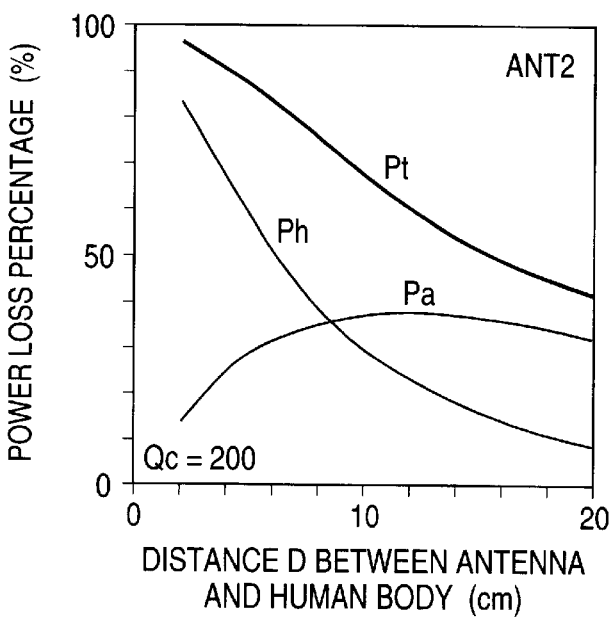
FIG. 4
|  | ANTENNA TYPE | | |
|---|---|---|---|
|  | ANT1 | ANT2 | ANT3 |
| RELATED ART | -21.0 | -16.4 | -10.8 |
| FIRST EMBODIMENT | -10.2 | -8.4 | -5.8 |
[ dBd ]

| | ANTENNA TYPE | | |
|---|---|---|---|
| | ANT1 | ANT2 | ANT3 |
| P | 1.3 | 1.9 | 3.4 |
| N | 45 | 48 | 48 |
| L | 59 | 92 | 163 |

[ mm ]

ANTENNA APPARATUS

BACKGROUND OF THE INVENTION

This invention relates to an antenna mainly mounted on a portable radio apparatus and in particular to an antenna apparatus capable of providing a good radiation characteristic even in a state in which a portable radio is brought close to a human body.

In recent years, a compact, lightweight, and slim radio has been required as a radio apparatus for business use mainly operated in a VHF (very high frequency) band, and a small-sized portable radio apparatus as compared with the wavelength has been used. A normal mode helical antenna (NHA, hereinafter) of a quarter wavelength monopole antenna shape is generally available as a portable radio antenna for business use in a related art, and a small-sized antenna system excellent in portability kept out of the way of the user at the carrying time is provided.

FIG. 10 shows a portable radio apparatus. An NHA 20 wound in helical is electrically connected at one end to a radio apparatus main unit 21, where by a compact and lightweight antenna system is provided. Generally, the NHA 20 is designed so that the electric length becomes a quarter wavelength to match a radio circuit, and is matched to any desired resonance frequency in a free space. If the electric length of the NHA 20 does not become a quarter wavelength, the NHA 20 is designed so as to provide sufficient radiation performance in the free space by inserting a matching circuit between the NHA 20 and a radio circuit for matching.

However, if the NHA 20 shown in FIG. 10 is brought close to a human body for use, it receives the effect of the human body medium having a high dielectric constant and the radiation performance is largely degraded; this is a problem. Unlike a portable telephone, as shown in FIG. 11, a portable radio for business use is always fixed to a belt of the user so that it does not stand in the way of the radio user who works. In this state, the user communicates through a microphone and an earphone connected to the radio apparatus main unit. In this case, the NHA mounted on the radio apparatus main unit is brought extremely close to the belly of the human body and thus the antenna characteristic is strongly affected by the human body.

Hitherto, the effect of the positional relationship between the human body and the antenna on the antenna characteristic has been examined in various manners, and it is made clear that as the antenna is brought close to the human body, the gain is lowered. As the antenna is brought close to the human body, the input impedance of the antenna changes and does not match that of a circuit and a loss is caused by reflection. Further, a part of electromagnetic wave radiated from the antenna is absorbed in the antenna itself or the human body, causing a loss.

Conventionally, the radiation characteristic of the antenna has been based on the result considering only some electromagnetic waves radiated from the antenna and thus the loss caused by the impedance mismatch and the loss caused by absorbing the electromagnetic waves in the antenna or the human body has not been considered. However, the percentage occupied by the losses may be large depending on the frequency band and the antenna type.

As for an NHA reduced to 0.1 wavelength or less put to use in a 150-MHz band particularly, for example, like an antenna mounted on a portable radio for business use, the input impedance of the NHA in the proximity of the antenna changes sharply and thus a correct evaluation needs to be performed on the loss caused by the impedance mismatch. Further, such an NHA, which is small-sized, has small radiation resistance and therefore it is also necessary to consider the losses of high-frequency resistance of the metal line forming the antenna and a matching circuit.

As described above, to examine the radiation characteristic of the antenna, the percentage occupied by lost power in radiated electromagnetic waves varies depending on the antenna type as well as the frequency band and the lost power composition ratio also varies. Therefore, to improve the radiation characteristic of the antenna and design an antenna apparatus having a high gain, the factor of occurrence of lost power needs to be considered to minimize the lost power.

SUMMARY OF THE INVENTION

It is therefore an object of the invention to provide a high-gain antenna apparatus with a power loss minimized considering the occurrence factor of lost power.

According to a first aspect of the invention, an antenna apparatus in a portable radio apparatus comprises an antenna element mounted which receives electric power from a radio circuit in the portable radio apparatus and matching in a predetermined frequency band, and a matching circuit which matches impedance of the antenna element and internal impedance of the radio circuit, wherein the matching circuit has a match characteristic to conjugately match the internal impedance of the radio circuit and input impedance of the matching circuit.

According to a second aspect of the invention, the antenna apparatus according to the first aspect of the invention further comprises a match characteristic controller for varying the match characteristic of the matching circuit in response to change in the impedance of the antenna element.

According to a third aspect of the invention, an antenna apparatus according to the second aspect of the invention, wherein the match characteristic controller varies load of the matching circuit in response to change in the impedance of the antenna element to selectively adapt to at least the impedance of the antenna element when the antenna element is brought close to a human body with a sufficiently small spacing relative to the wavelength of the predetermined frequency band and the impedance of the antenna element when the antenna element is in a free space.

According to a fourth aspect of the invention, an antenna apparatus according to the second aspect of the invention, wherein the match characteristic controller varies capacitance load of the matching circuit in response to change in the impedance of the antenna element.

According to a fifth aspect of the invention, an antenna apparatus according to the first aspect of the invention, wherein the matching circuit includes a first matching circuit having a match characteristic to conjugately match the internal impedance of the radio circuit and the input impedance of the matching circuit when the portable radio is brought close to a human body with a sufficiently small spacing relative to the wavelength of the predetermined frequency band.

According to a sixth aspect of an antenna apparatus according to the fifth aspect of the invention, wherein the matching circuit further includes a second matching circuit having a match characteristic to conjugately match the internal impedance of the radio circuit and the input impedance of the matching circuit in a free space, and a selector which selects the first matching circuit or the second matching circuit in response to change in the impedance of the antenna element.

According to a seventh aspect of the invention, an antenna apparatus according to second aspect of the invention further comprises a mismatch detector which monitors electric power supplied to the antenna element and reflected because of a mismatch and detecting change in the impedance of the antenna element, wherein the match characteristic controller is controlled in response to the detection result of the mismatch detector.

According to an eighth aspect of the invention, an antenna apparatus according to the sixth aspect of the invention further comprises a mismatch detector which monitors electric power supplied to the antenna element and reflected because of a mismatch and detecting change in the impedance of the antenna element, wherein the selector is controlled in selection in response to the detection result of the mismatch detector.

According to the first aspect of the invention, the internal impedance of the radio circuit and the input impedance of the matching circuit are conjugately matched to each other, whereby the mismatch loss caused by the impedance mismatch of the antenna element can be decreased.

According to the second aspect of the invention, the match characteristic control means can vary the match characteristic of the matching circuit in response to change in the impedance of the antenna element, so that the match characteristic can be changed in response to the use state of the portable radio installing the antenna apparatus.

According to the third aspect of the invention, the match characteristic control means can switch the load of the matching circuit, whereby a plurality of match characteristics including the match characteristic corresponding to the impedance of the antenna element when the antenna element is brought close to a human body and the match characteristic corresponding to the impedance of the antenna element when the antenna element is in a free space can be selectively adapted in response to change in the impedance of the antenna element.

According to the fourth aspect of the invention, the capacitance load of the matching circuit is varied continuously in response to change in the impedance of the antenna element, whereby the match characteristic can be continuously adapted in response to change in the impedance of the antenna element.

According to the fifth aspect of the invention, the match characteristic of the matching circuit is set so that the internal impedance of the radio circuit and the input impedance of the matching circuit conjugately match each other in a state in which the antenna element is brought close to a human body, whereby the mismatch loss caused by the impedance mismatch of the antenna element can be decreased in a state in which the portable radio is carried for use.

According to the sixth aspect of the invention, the first matching circuit set so that the internal impedance of the radio circuit and the input impedance of the matching circuit conjugately match each other when the antenna is brought close to a human body and the second matching circuit set so that the internal impedance of the radio circuit and the input impedance of the matching circuit conjugately match each other in a free space are selectively switched in response to change in the impedance of the antenna element, whereby the mismatch loss caused by the impedance mismatch of the antenna element can be decreased both when the antenna is brought close to a human body and when the antenna is in a free space.

According to the seventh aspect of the invention, an impedance mismatch of the antenna element is detected and the match characteristic control means can be controlled based on the detection result for varying the match characteristic.

According to the eighth aspect of the invention, an impedance mismatch of the antenna element is detected and the selection means is controlled in selection based on the detection result for varying the match characteristic.

BRIEF DESCRIPTION OF THE DRAWINGS

FIG. 2 is a drawing to show the radiation efficiency of the antenna apparatus;

FIG. 3 is a drawing to show the power loss rate of ANT2;

FIG. 4 is a comparison drawing to show the improvement amounts of the maximum gains of antenna apparatus;

DETAILED DESCRIPTION OF THE PREFERRED EMBODIMENTS

Referring now to the accompanying drawings, there are shown preferred embodiments of the invention.

With the antenna apparatus according to the invention, the mismatch loss caused by impedance change of the antenna element is decreased by conjugately matching the internal impedance of the radio circuit and the input impedance of the matching circuit to each other. Generally, to improve the radiation characteristic of the antenna apparatus, the loss occurring when an electromagnetic wave is radiated needs to be minimized. The loss is made up of a plurality of elements depending on the occurrence cause. The elements will be discussed below.

Figure 11:
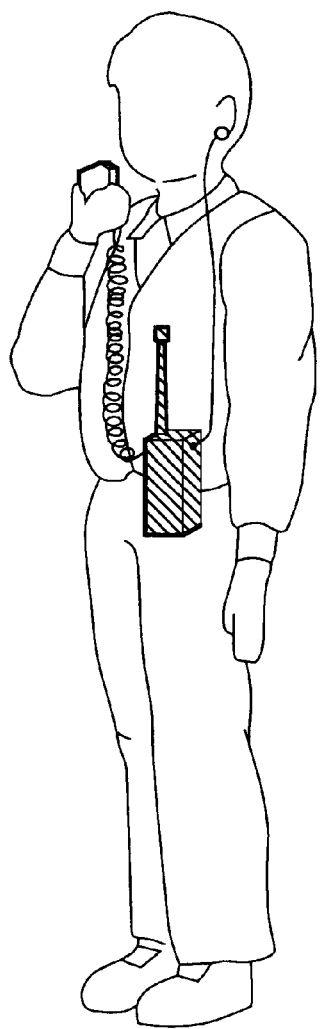
FIG. 11 is a drawing to show how a portable radio is used.

If the portable radio main unit is fixed to a belt of the user as shown in FIG. 11, NHA is brought close to the belly of the human body 5 [cm] or less. This means that it is placed at an extremely close distance of one-fortieth or less wavelength in a 150-MHz band. In this case, impedance drastically changes as compared with NHA placed in a free space and it is conceivable that a large loss (mismatch loss) will occur. As the mismatch loss grows, the antenna characteristic also changes largely.

Figure 10:
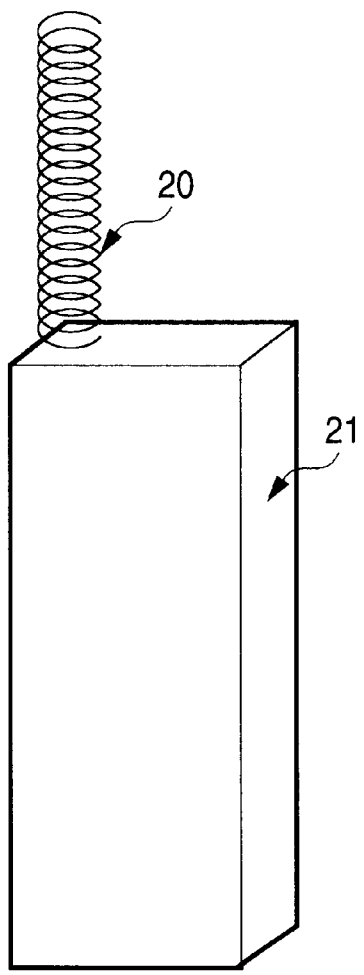
FIG. 10 is an external view to show a portable radio.
Figures 12, 13:
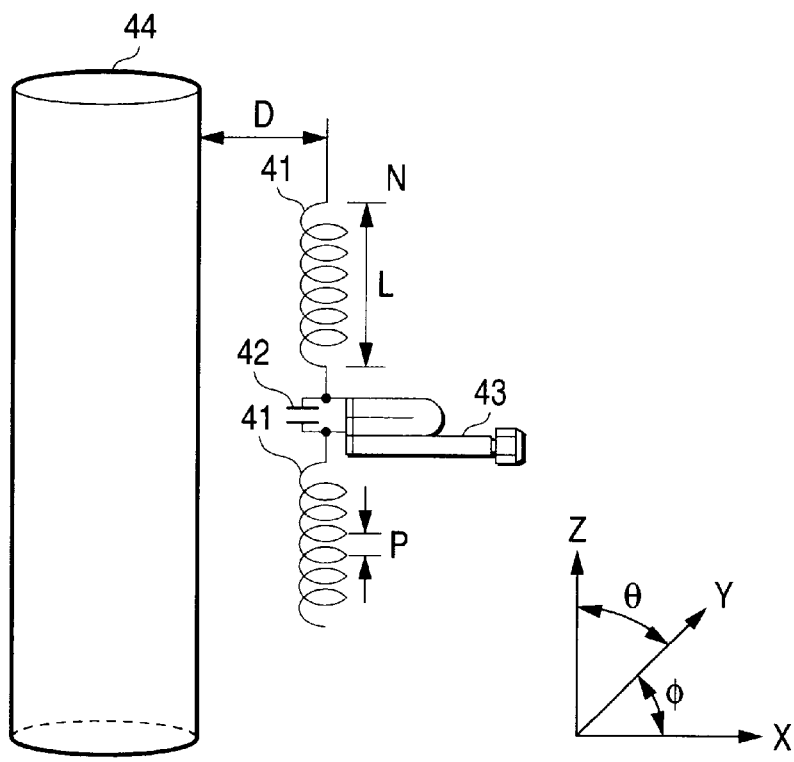
FIG. 12 is a drawing to show an analysis model to analyze the characteristic of an antenna apparatus.
FIG. 13 is a drawing to show NHA shape parameters.

FIG. 12 shows an analysis model to examine how the characteristic of an antenna apparatus is affected by a human body and is changed. For simplicity, an antenna structure with a cabinet as shown in FIG. 10 is modeled as a dipole shape with a pair of NHAs. In FIG. 12, numeral 41 denotes an NHA, numeral 42 denotes a matching circuit, numeral 43 denotes balun, and numeral 44 denotes a human body model. The NHA 41 has an antenna shape embodied as a winding diameter of 7.5 [mm], a metal line diameter of 1 [mm], pitch P, the number of windings N, and axial length L.

Using the analysis model, analysis was conducted on NHAs 41 (ANT1, ANT2, and ANT3) different in the pitch P, the number of windings N, the axial length L as shown in FIG. 13. The shape of the NHA 41 was determined referring to a practical antenna of a portable radio for business use.

In the parameters shown in FIG. 13, the winding length of one element becomes about a quarter wavelength. The NHA 41 resonates almost at 150 [MHz] and the matching circuit 42 matches. The balun 43 is an ideal transformer with transformation ratio 1:4 as feed narrow band approximation to convert a radio circuit of unbalanced system feed into a balanced system radio circuit. The human body model 44 is provided as a circular cylinder 22 [cm] in diameter and 170 [cm] in height. The NHA 41 was installed vertically at a position at distance D from the circular cylinder surface of the human body model 44 and 85 [cm] in height (the center point of the human body model 44). To apply method of moment, the human body model 44 was approximated as a circular cylinder with 11 circles and 16 lines. The human body model 44 has a relative dielectric constant of 57.7 and to shorten the calculation time, was equivalently replaced with a wire grid.

Figure 14:
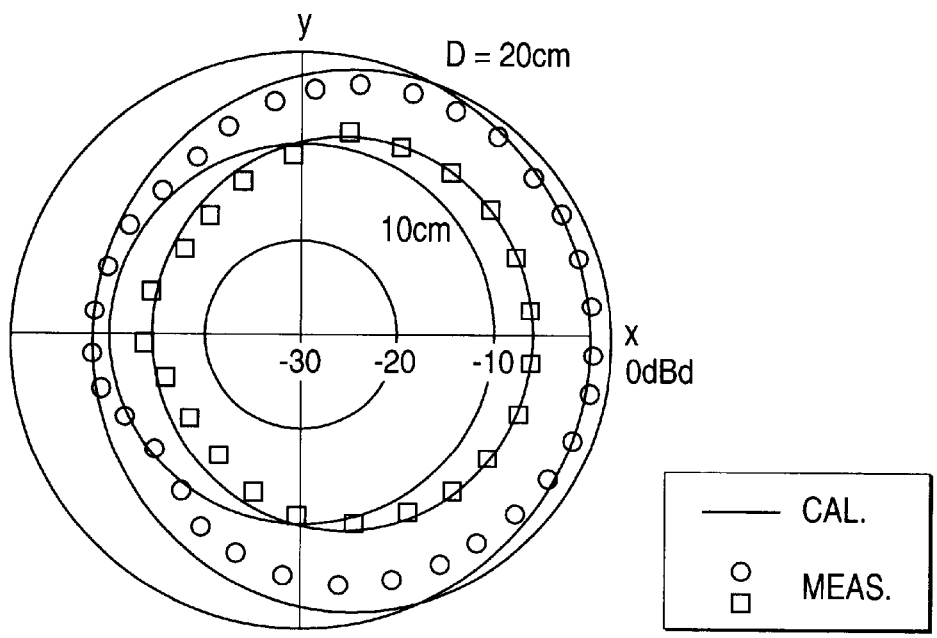
FIG. 14 is a drawing to show the radiation directional characteristic of ANT2 analyzed using the analysis model.

FIG. 14 shows the result of analyzing the radiation directional characteristic when the ANT2 shown in FIG. 13 is brought close to a human body using the analysis model shown in FIG. 12. The radiation directional characteristic is found by interpolation with the calculation values indicated by the solid lines based on the measurement values indicated by ○ and □. As seen in FIG. 14, as the human body and the antenna are brought close to each other, namely, the distance D is shorted from 20 [cm] to 10 [cm], the directivity pattern is rapidly made small and the radiation efficiency of the antenna is degraded.

Figure 15:
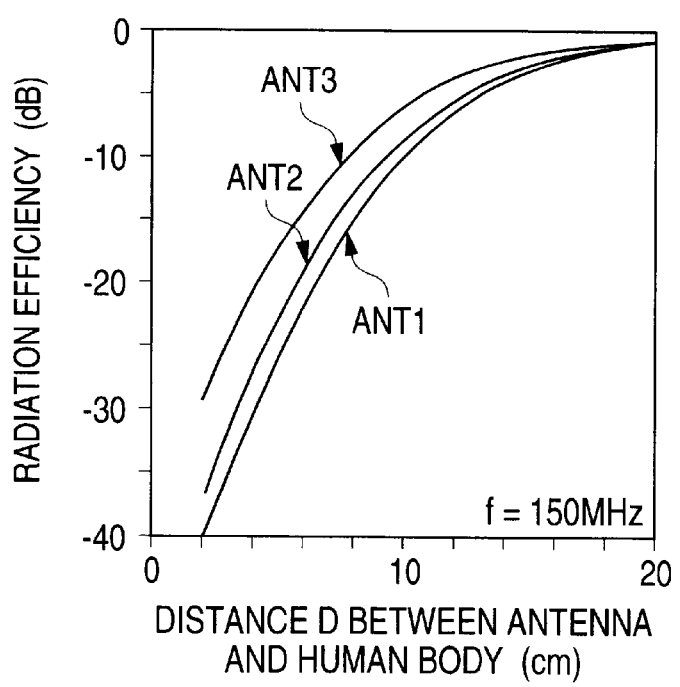
FIG. 15 is a drawing to show the relationship of radiation efficiency with the distance between the antenna and a human body.

FIG. 15 shows the relationship of the radiation efficiency with the distance D between the antenna and the human body. As shown in FIG. 15, as the antenna is brought close to the human body, the radiation efficiency is degraded extremely with almost D=10 [cm] as the boundary. Therefore, the communication-possible area of the radio becomes extremely narrow in a use state in which the portable radio apparatus main unit is fixed to a human body and the distance D between the antenna and the human body becomes 5 [cm] or less, namely, the human body and the antenna are brought extremely close to each other.

Figure 16:
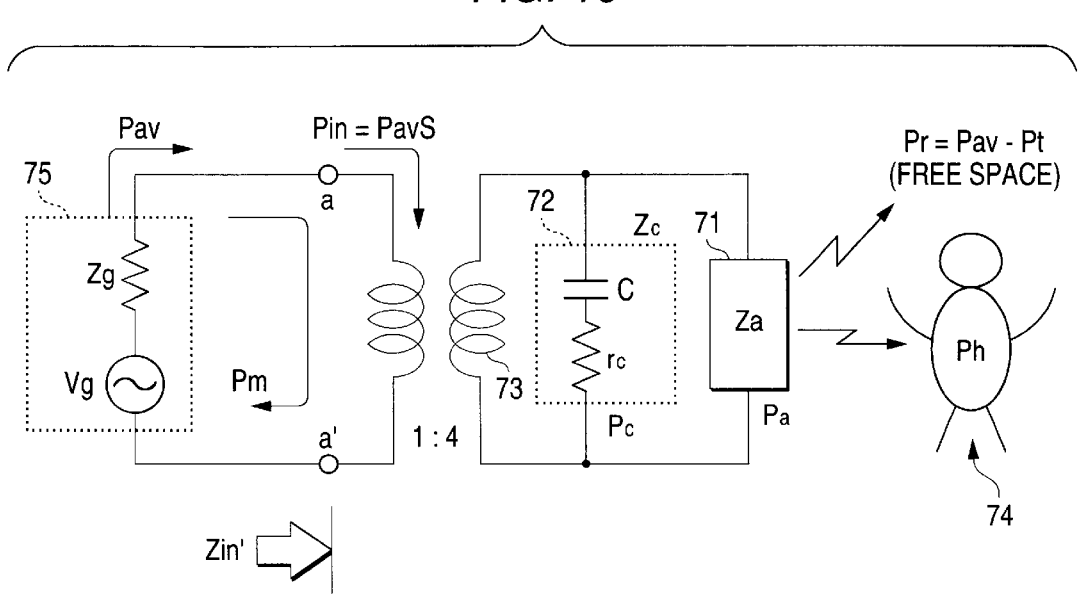
FIG. 16 is a circuit diagram to show an equivalent circuit when the antenna apparatus is brought close to a human body.

The factors of degrading the radiation efficiency of the antenna will be discussed. FIG. 16 shows an equivalent circuit when the antenna apparatus is brought close to a human body. In the figure, numeral 71 denotes NHA, numeral 72 denotes a matching circuit, numeral 73 denotes balun, numeral 74 denotes a human body, and numeral 75 denotes a transmitter. The equivalent circuit shown in the figure is excited by power supply $V_g$ of internal impedance $Z_g$ of the transmitter 75. Letting the impedance of the NHA 71 be $Z_a$ and the impedance of the matching circuit (parallel capacitance C) 72 be $Z_c$, input impedance $Z_{in}$ viewed from input terminals a–a' of the NHA 71 is represented by expression (1).

$$Z_{in}=(¼) \cdot \{Z_a Z_c/(Z_a+Z_c)\} \quad (1)$$

When the antenna is brought close to the human body, change in the impedance $Z_a$ caused by the mutual effect of the NHA 71 and the human body 74 is actually observed as change in $Z_{in}$ according to expression (1).

Assuming that the input impedance in expression (1) in a free space is $Z_{in}$ and that $Z_{in}$ and the internal impedance $Z_q$ of the power supply conjugately match each other, the relation of $Z_{in}=Z_q^*$ holds where * denotes complex conjugate. As the NHA 71 is brought close to the human body 74 from the state, the input impedance of the NHA 71 changes to $Z_{in}'$. At this time, input power $P_{in}$ applied to the NHA 71 is represented by expression (2)

$$P_{in}=(½) \cdot Re[Z_{in}'I_1 I_1^*] \quad (2)$$

where $I_1=V_g/(Z_g+Z_{in}')$

On the other hand, the input power $P_{in}$ is supplied from the power supply $V_q$ and therefore is represented by expression (3).

$$P_{in} = (1/2) \cdot (|V_g|^2 \cdot Re[Z'_{in}]/|Z_g + Z'_{in}|^2) \quad (3)$$
$$= P_{av} \cdot S$$

where $P_{av}=|V_g|^2/8Re[Z_g]$ $$S=(4Re[Z_g]Re[Z_{in}'])/|Z_g+Z_{in}'|^2 \leq 1$$

Re[X] denotes a real part of X, $P_{av}$ denotes available power of the power supply, and S denotes the ratio between the power supplied to the NHA 71 and the available power of the power supply. Therefore, S=1 under the condition of conjugate match (state in free space). Here, radiation efficiency relative to the available power, η, is defined by expression (4).

$$\eta=P_r/P_{av}=(P_{av}-P_t)/P_{av} \quad (4)$$

where $P_t=P_h+P_a+P_c+P_m$

In expression (4), $P_r$ denotes radiation power to space, $P_t$ denotes the total amount of lost power, $P_h$ denotes power absorbed in the human body 74, $P_a$ denotes lost power caused by high-frequency resistance of the metal line forming the NHA 71, $P_c$ denotes lost power caused by lost resistance $r_c$ of the parallel capacitance C, and $P_m$ denotes lost power caused by an impedance mismatch. The balun 73 is no loss. The power relationship is shown in FIG. 17 and $P_h$, $P_a$, $P_c$, and $P_m$ are represented by expressions (5) to (8).

$$P_h=(½) \cdot \Sigma Re[Z_{Lh}]I_h^2 \quad (5)$$
$$P_a=(½) \cdot \Sigma Re[Z_{La}]I_a^2 \quad (6)$$
$$P_h=(½) \cdot r_c I_c^2 \quad (7)$$
$$P_m=(1-S)P_{av} \quad (8)$$

wherein $Z_{Lh}$ denotes load impedance of the human body, $I_h$ is a current flowing through the human body, $Z_{La}$ denotes lost resistance caused by surface impedance of the metal line forming the helical, and $I_a$ denotes a current on the helical. The lost resistance $Z_{La}$ is represented by expression (9).

$$Z_{La}=(1+j)/2\pi r\sigma_a d_s$$
$$d_s=(2/\omega\mu_0\sigma_a)^{1/2} \qquad (9)$$

where $d_s$ denotes the thickness of surface resistance and $\sigma_a$ denotes the conductivity of the metal line and $\sigma_a$=5.7×10⁻⁷ [S/m]. $\mu_0$ denotes a transmission factor in a vacuum and $\mu_0$=4π×10⁻⁷ [A/m]. $I_c$ denotes a current in parallel capacitance. $r_c$ denotes equivalent series resistance of capacitance and the relation with Q-value of capacitance ($Q_c$) is represented by expression (10).

$$r_c=1/\omega C Q_c \qquad (10)$$

Usually, the radiation efficiency is defined by the ratio between total radiation power and net power input to the antenna, $P_r/P_{in}$. On the other hand, the radiation efficiency defined by expression (4) represents the conversion percentage of the available power $P_{av}$ to radiation power through the antenna. The radiation efficiency is similar to a conversion power gain used in design of a two-terminal circuit network in a circuit theory and contains the effect of the impedance mismatch loss $P_m$. Therefore, it indicates the effective radiation efficiency (substantial radiation efficiency) in the use state and is effective for examining the execution performance of the antenna containing the mismatch loss.

Figure 17A:
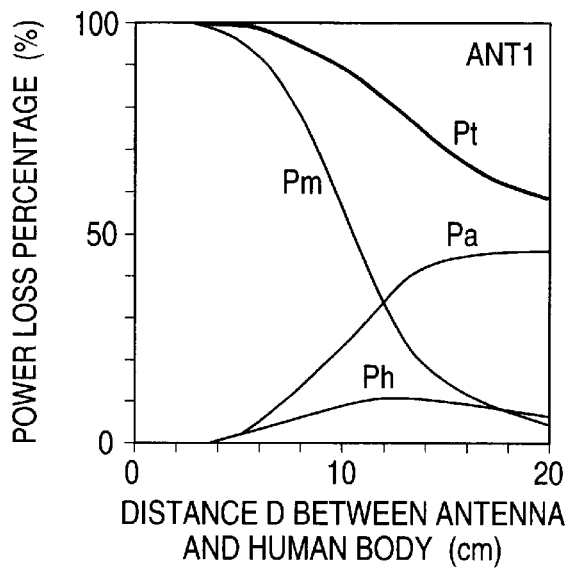
FIGS. 17A to 17C are drawings to show the factor percentage of lost power occurring when each antenna apparatus is brought close, to a human body.
Figure 17B:
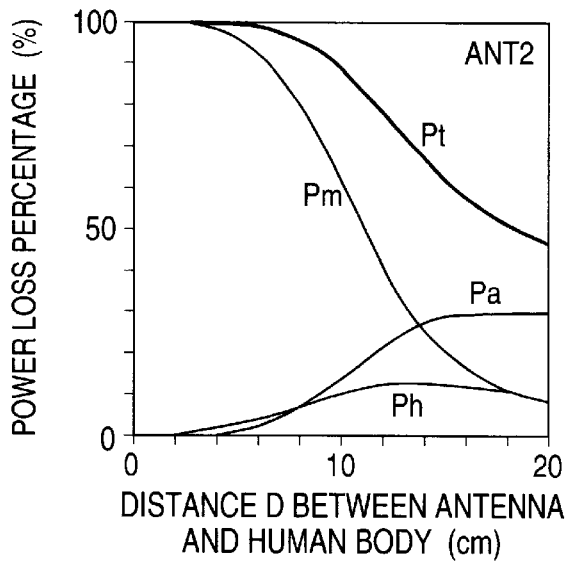
Figure 17C:
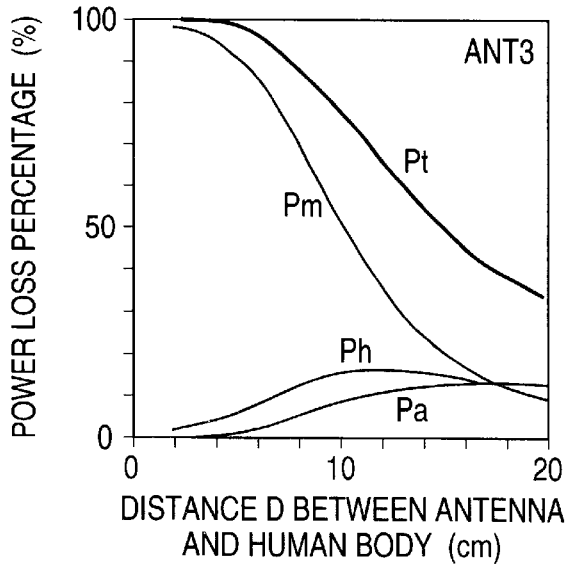

FIGS. 17A to 17C shows the factor percentage of lost power occurring when ANT1 to ANT3 under the conditions shown in FIG. 13 are brought close to a human body and show each the relationship between the power loss percentage [%] (vertical axis) and the distance D between the antenna and the human body (horizontal axis). In the figures, $P_t$ denotes the total amount of lost power, $P_h$ denotes power absorbed in the human body, $P_a$ denotes lost power caused by the conductor loss of the antenna, and $P_m$ denotes lost power caused by impedance mismatch. The power values shown in FIGS. 17A to 17C are values all normalized by the available power $P_{av}$. The lost power $P_c$ caused by the parallel capacitance C is 1 [%] or less and therefore is not shown.

As shown in FIGS. 17A to 17C, when every antenna is brought close to the human body at D<10 [cm], the percentage occupied by the lost power caused by impedance mismatch, $P_m$, in the total amount of lost power, $P_t$, becomes large and becomes the main factor of lost power. Further, the trend is promoted with ANT1 meaning an antenna having short axis length L. However, in the region where D>10 [cm], the percentage occupied by the conductor lost power $P_a$ in the total amount of lost power $P_t$, becomes large and in ANT1, the conductor lost power $P_a$ exceeds the power absorbed in the human body $P_h$, and becomes the main factor of lost power.

As described above, considering the distance D between the antenna and the human body and the power loss percentage, the lost power composition ratio varies rapidly with the specific value (D=10 [cm]) as the boundary. Considering each lost power, the lost power caused by impedance mismatch, $P_m$, shows the maximum value in the range of 0<D<10 [cm] and the conductor lost power $P_a$ and the power absorbed in the human body, $P_h$, indicate each the maximum value in the range of 10<D<20 [cm]. Therefore, in the use state in which the antenna is brought extremely close to the human body, to minimize the lost power, it is effective to decrease the lost power caused by impedance mismatch, $P_m$.

The invention is intended for decreasing the lost power caused by impedance mismatch, the dominant factor in the use state in which the antenna is brought extremely close to the human body, of the lost power resulting in degradation of the radiation efficiency of the antenna based on the above-described knowledge.

Embodiment 1

Figure 1:
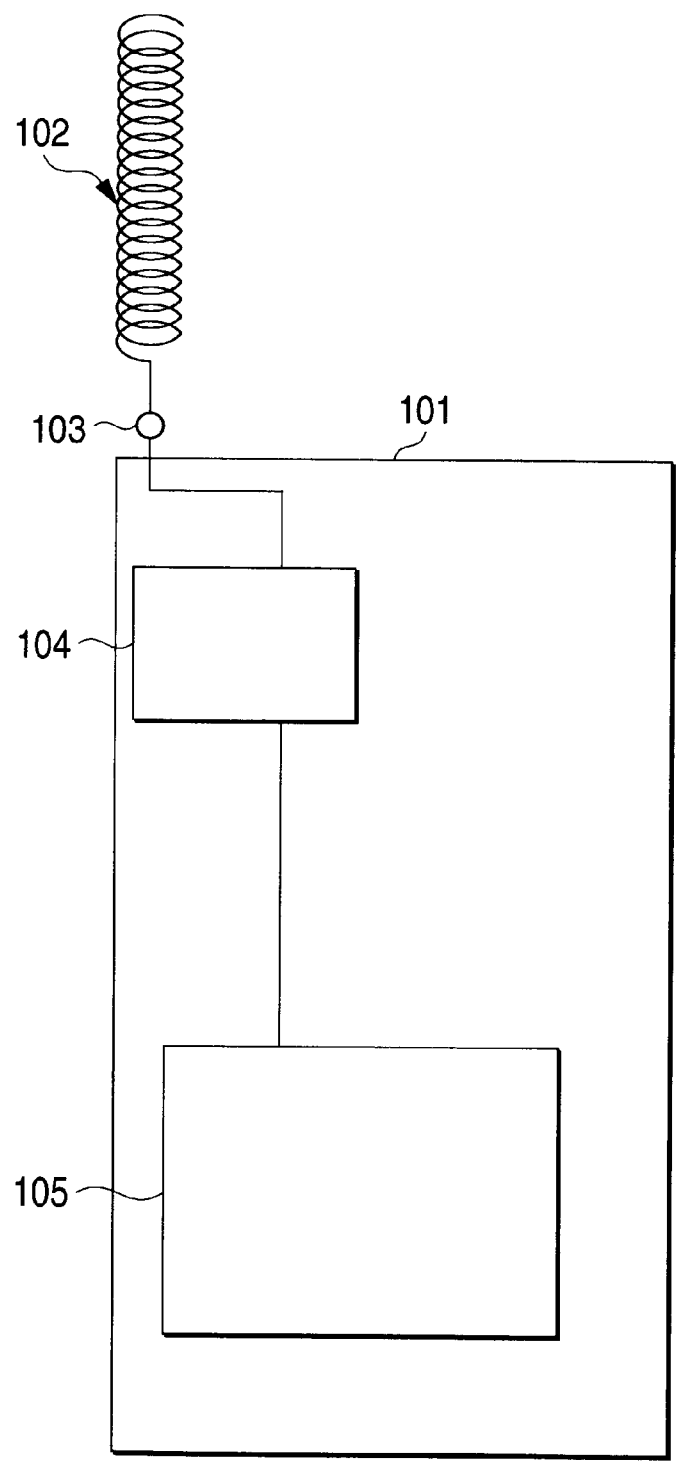
FIG. 1 is a diagram to show the configuration of an antenna apparatus according to a first embodiment of the invention.

FIG. 1 shows the configuration of an antenna apparatus according to a first embodiment of the invention. In the figure, numeral 101 denotes a radio main unit, numeral 102 denotes an NHA, numeral 103 denotes a feeding point for supplying power to the NHA 102, numeral 104 denotes a matching circuit, and numeral 105 denotes a radio circuit. The matching circuit 104 causes the radio circuit 105 and the NHA 102 to match electrically. The characteristic of the matching circuit 104 is set so that input impedance $Z_{in}$ of the matching circuit 104 viewed from the radio circuit 105 and internal impedance $Z_g$ of the radio circuit 105 have conjugate match relationship. Accordingly, a mismatch loss occurring when the input impedance of the NHA 102 changes is decreased.

FIG. 2 is a drawing to show the radiation efficiency of the antenna apparatus having ANT1 to ANT3 shown in FIG. 13. It shows a case where the characteristic of the matching circuit 104 is set to a conjugate match and a mismatch loss is removed in the antenna apparatus shown in FIG. 1. As compared with the radiation efficiency characteristic containing the mismatch loss shown in FIG. 15, the radiation efficiency characteristic is improved 10 dB or more particularly in the region where the distance D between antenna and human body<10 cm.

FIG. 3 is a drawing to show the power loss percentage of ANT2 of the antenna apparatus shown in FIG. 13. In FIG. 3, $P_c$ denotes the total amount of lost power, $P_h$ denotes power absorbed in the human body, and $P_a$ denotes lost power caused by the conductor loss of the antenna; the values are all normalized by available power $P_{av}$. Since the mismatch loss is removed by the matching circuit 104, in the region where the distance D between antenna and human body<10 cm, the percentage occupied by the power absorbed in the human body, $P_h$, is higher than the percentage occupied by the lost power caused by the conductor loss of the antenna, $P_a$. A similar trend is also seen in other types of antenna apparatus.

FIG. 4 shows the improvement amounts of the maximum gains of the antenna apparatus, wherein ANT1 to ANT3 shown in FIG. 13 (matching in free space in the related art) are compared with the first embodiment (removing mismatch loss by conjugate match). In FIG. 4, the values represent the maximum gains on the horizontal plane (X-Y plane) when the antenna is brought close to the human body (D=5 cm); the larger the value, the more excellent provided the gain. The maximum gain occurs in the X direction, namely, the human body front direction, as shown in FIG. 14. The maximum gains are measured assuming the actual use state of a radio for business use as shown in FIG. 11. The test subject is a 30-year-old male who is 171 cm tall and weighs 75 kg. As seen in FIG. 4, drastic gain improvement of 5 to 10 dB or more can be realized by providing the matching circuit set to conjugate match when the antenna is brought close to the human body, and the effect is noticeable as an antenna has a shorter axis length like ANT1.

Embodiment 2

A second embodiment of the invention will be discussed with reference to the accompanying drawings.

Figure 5:
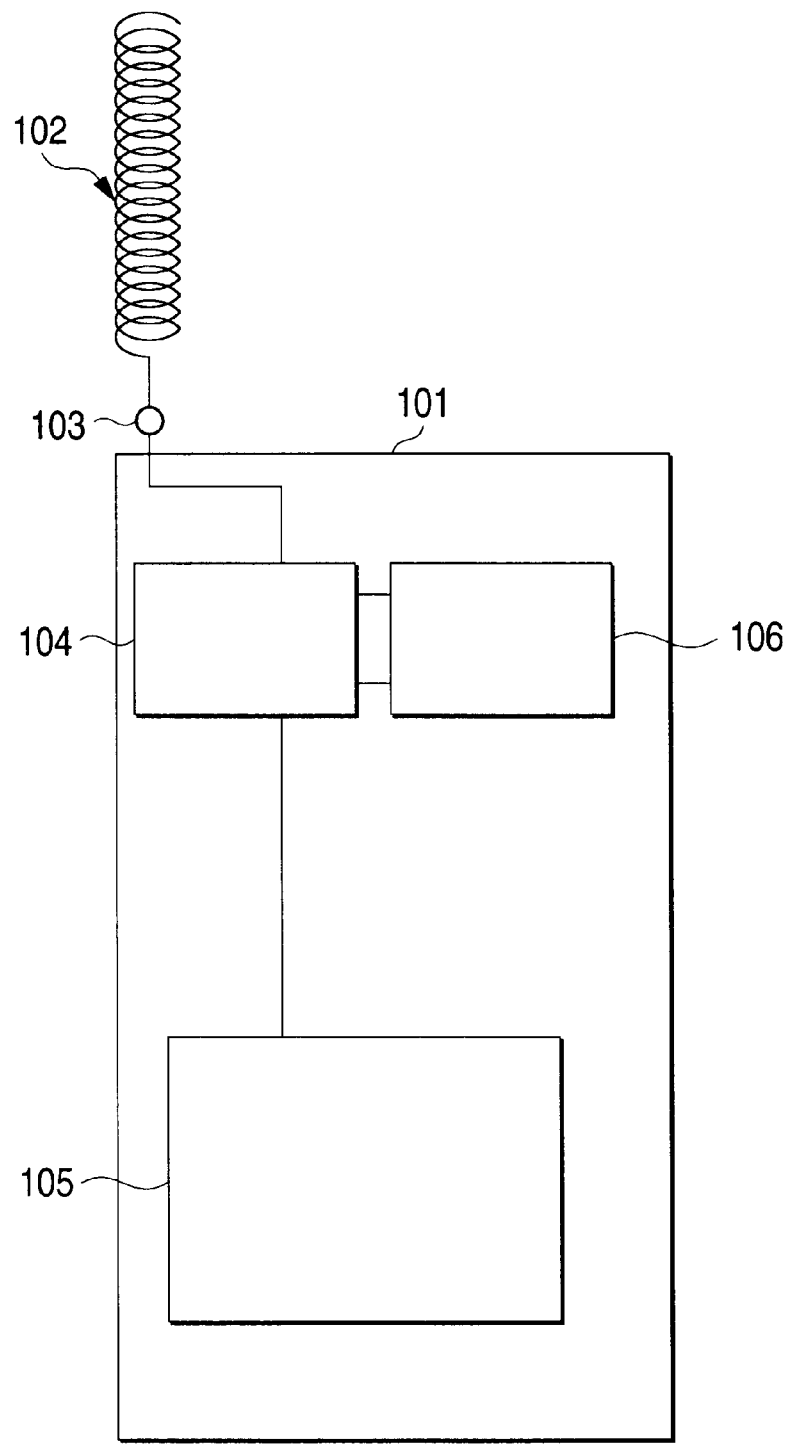
FIG. 5 is a diagram to show the configuration of an antenna apparatus according to a second embodiment of the invention.

FIG. 5 shows the configuration of an antenna apparatus according to a second embodiment of the invention. Parts identical with those previously described with reference to FIG. 1 are denoted by the same numerals in FIG. 5 and will not be discussed again in detail. The antenna apparatus of the second embodiment further comprises a load switch circuit 106 (match characteristic control means) for switching load of a matching circuit 104. That is, the load of the matching circuit 104 is switched by the load switch circuit 106 so that input impedance $Z_{in}$ of the matching circuit 104 viewed from a radio circuit 105 has conjugate match relationship with internal impedance $Z_g$ of the radio circuit 105 both when the antenna is in a free space and when the antenna is brought close to a human body. Accordingly, the mismatch loss is decreased both when the antenna is in a free space and when the antenna is brought close to a human body, so that the radiation efficiency of the antenna apparatus can be improved.

The configuration of the load switch circuit 106 will be discussed with reference to FIGS. 6A to 6C. The configuration of the load switch circuit 106 may be any if any load can be connected to the matching circuit 104, and is not limited to the configuration examples in FIGS. 6A to 6C.

Figure 6A:
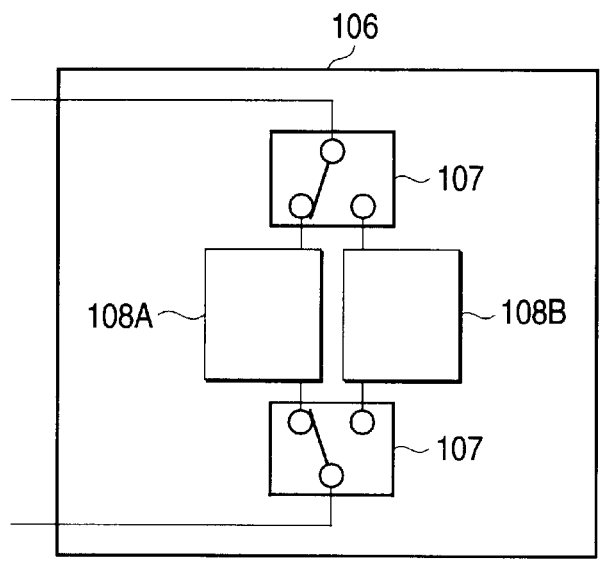
FIGS. 6A to 6C are diagrams to show configuration examples of a load switch circuit 106.

FIG. 6A shows a first configuration example of the load switch circuit 106. In the figure, numeral 107 denotes a changeover switch, numeral 108A denotes a load circuit for free space, and numeral 108B denotes a load circuit for the time when the antenna is brought close to a human body. The load circuit connected to the matching circuit 104 is switched between 108A and 108B by the changeover switches 107 in response to impedance change of an NHA 102. When the NHA 102 is in a free space, the load circuit for free space 108A is connected to the matching circuit 104 and when the NHA 102 is brought close to a human body, the load circuit for the time when the antenna is brought close to a human body 108B is connected to the matching circuit 104. Each load circuit is set to a proper value, so that the input impedance $Z_{in}$ of the matching circuit 104 has conjugate match relationship with the internal impedance $Z_g$ of the radio circuit 105, and an antenna matching condition responsive to the impedance change of the NHA 102 can be formed.

The load switch circuit 106 shown in FIG. 6A is configured to select either of the two load circuits corresponding to the antenna condition in free space and that when the antenna is brought close to a human body. Three or more load circuits corresponding to three or more antenna conditions maybe provided and the load switch circuit may be configured to select any one of the load circuits corresponding to the antenna conditions in response to impedance change. Accordingly, antenna matching conditions flexibly responsive to various impedance changes of the NHA 102 accompanying change in the use state of the portable radio can be formed. If each load circuit may be grounded as connection, one changeover switch is omitted and each load circuit is directly grounded, so that each load circuit may be selected by a changeover switch.

Figure 6B:
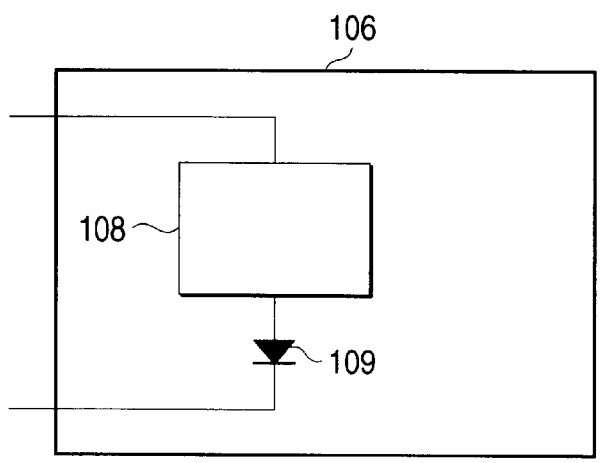

FIG. 6B shows a second configuration example of the load switch circuit 106. In the figure, numeral 108 denotes a load circuit and numeral 109 denotes a PIN diode connected in series to the load circuit 108. The load circuit 108 is connected to the matching circuit 104 by switching of the PIN diode 109 in response to impedance change of the NHA 102. The matching circuit 104 is set so as to become a conjugate match when the NHA 102 is in a free space. When the NHA 102 is brought close to a human body and the impedance of the NHA 102 changes, the PIN diode 109 is operated for connecting the load circuit 108 to the matching circuit 104. The load circuit is set to a proper value, so that the input impedance $Z_{in}$ of the matching circuit 104 when the antenna is brought close to a human body has conjugate match relationship with the internal impedance $Z_g$ of the radio circuit 105, and an antenna matching condition responsive to the impedance change of the NHA 102 can be formed. In the load switch circuit 106 shown in FIG. 6B, when the antenna is brought close to a human body, the PIN diode 109 is operated, thereby connecting the load circuit 108 to the matching circuit 104 having a conjugate match characteristic in a free space. However, the PIN diode 109 is operated in a free space, whereby the load circuit 108 may be connected to the matching circuit 104 having a conjugate match characteristic when the antenna is brought close to a human body.

Figure 6C:
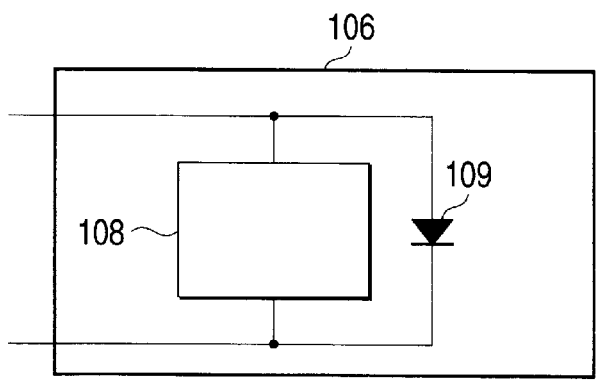

FIG. 6C shows a third configuration example of the load switch circuit 106. In the figure, numeral 108 denotes a load circuit and numeral 109 denotes a PIN diode connected in parallel to the load circuit 108. The load circuit 108 is bypassed by switching of the PIN diode 109 in response to impedance change of the NHA 102. The matching circuit 104 is set so as to become a conjugate match when the antenna is brought close to a human body. When the NHA 102 is brought close to a human body and the impedance of the NHA 102 changes, the PIN diode 109 is operated for bypassing the load circuit 108. The load circuit is set to a proper value, so that the input impedance $Z_{in}$ of the matching circuit 104 in a free space has conjugate match relationship with the internal impedance $Z_g$ of the radio circuit 105, and an antenna matching condition responsive to the impedance change of the NHA 102 can be formed. In the load switch circuit 106 shown in FIG. 6C, when the antenna is brought close to a human body, the PIN diode 109 is operated, thereby bypassing the load circuit 108 so that the load circuit 108 is not connected to the matching circuit 104 having a conjugate match characteristic when the antenna is brought close to a human body. However, the PIN diode 109 is operated in a free space, whereby the load circuit 108 may be bypassed so that the load circuit 108 is not connected to the matching circuit 104 having a conjugate match characteristic in a free space.

Embodiment 3

A third embodiment of the invention will be discussed with reference to FIG. 7.

Figure 7:
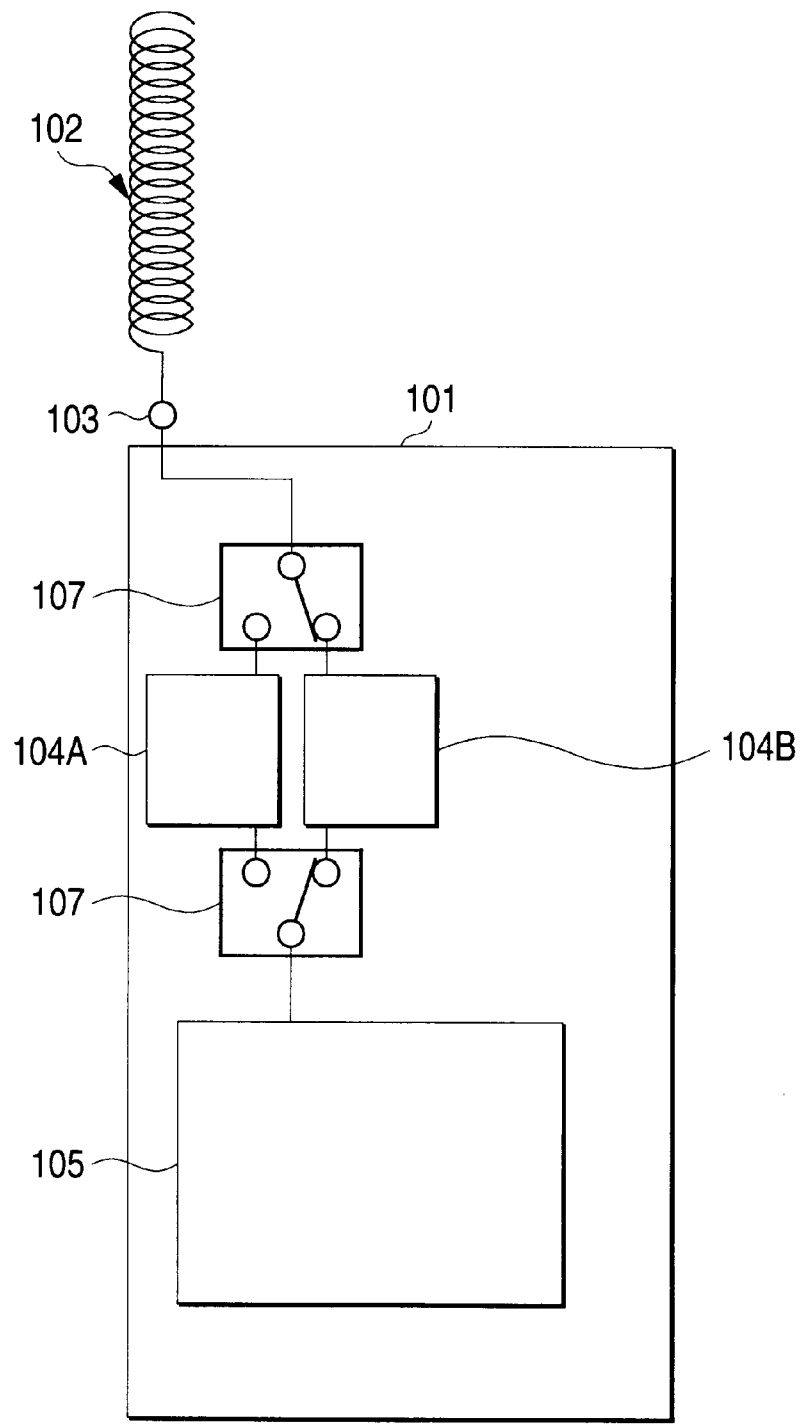
FIG. 7 is a diagram to show the configuration of an antenna apparatus according to a third embodiment of the invention.

FIG. 7 shows the configuration of an antenna apparatus according to a third embodiment of the invention. Parts identical with those previously described with reference to FIG. 1 are denoted by the same numerals in FIG. 7 and will not be discussed again in detail. The antenna apparatus of the third embodiment comprises a matching circuit for free space 104A having a conjugate match characteristic when an NHA 102 is in a free space, a matching circuit for the time when the antenna is brought close to a human body 104B having a conjugate match characteristic when the NHA 102 is brought close to a human body, and changeover switches 107 for selecting the matching circuit for free space 104A or the matching circuit for the time when the antenna is brought close to a human body 104B in response to the impedance change of the NHA 102. That is, the matching circuit is switched between the matching circuit for free space and the matching circuit for the time when the antenna is brought close to a human body by the changeover switches 107 so that input impedance $Z_{in}$ when the antenna side is viewed from a radio circuit 105 has conjugate match relationship with internal impedance $Z_g$ of the radio circuit 105.

Accordingly, the mismatch loss is decreased both when the antenna is in a free space and when the antenna is brought close to a human body, so that the radiation efficiency of the antenna apparatus can be improved.

FIG. 7 shows the configuration for selecting either of the two matching circuits corresponding to the antenna condition in free space and that when the antenna is brought close to a human body. Three or more matching circuits corresponding to three or more antenna conditions may be provided and any one of the matching circuits corresponding to the antenna conditions may be selected in response to impedance change. Accordingly, antenna matching conditions flexibly responsive to various impedance changes of the NHA 102 accompanying change in the use state of the portable radio can be formed.

Embodiment 4

A fourth embodiment of the invention will be discussed with reference to FIG. 8.

Figure 8:
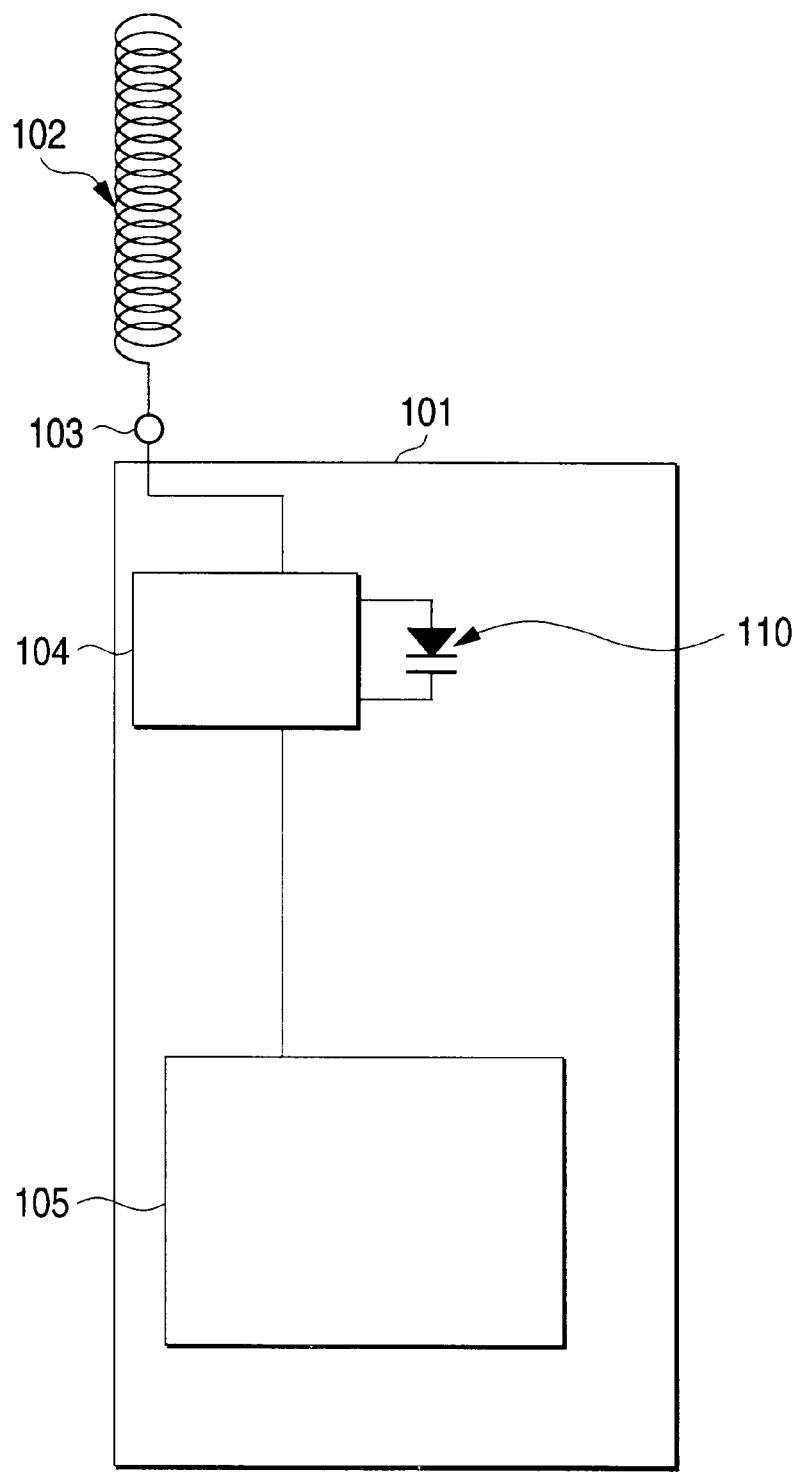
FIG. 8 is a diagram to show the configuration of an antenna apparatus according to a fourth embodiment of the invention.

FIG. 8 shows the configuration of an antenna apparatus according to a fourth embodiment of the invention. Parts identical with those previously described with reference to FIG. 1 are denoted by the same numerals in FIG. 8 and will not be discussed again in detail. The antenna apparatus of the fourth embodiment comprises a variable capacitance diode 110 (match characteristic control means) for varying the capacitance of a matching circuit 104. That is, the capacitance of the variable capacitance diode 110 is varied so that input impedance $Z_{in}$ of the matching circuit 104 viewed from a radio circuit 105 has conjugate match relationship with internal impedance $Z_g$ of the radio circuit 105 in a free space or when the antenna is brought close to a human body. Accordingly, the mismatch loss is also decreased in an arbitrary impedance condition in the process in which an NHA 102 is brought close to a human body from in a free space as well as when the NHA 102 is in a free space and when the NHA 102 is brought close to a human body, so that the radiation efficiency of the antenna apparatus can be improved. The capacitance value of the variable capacitance diode 110 connected to the matching circuit 104 is varied stepwise in response to the impedance change of the NHA 102, the input impedance $Z_{in}$ of the matching circuit 104 has conjugate match relationship with the internal impedance $Z_g$ of the radio circuit 105 both when the antenna is in a free space and when the antenna is brought close to a human body, and an antenna matching condition responsive to the impedance change of the NHA 102 can be formed.

Embodiment 5

A fifth embodiment of the invention will be discussed with reference to FIG. 9.

Figure 9:
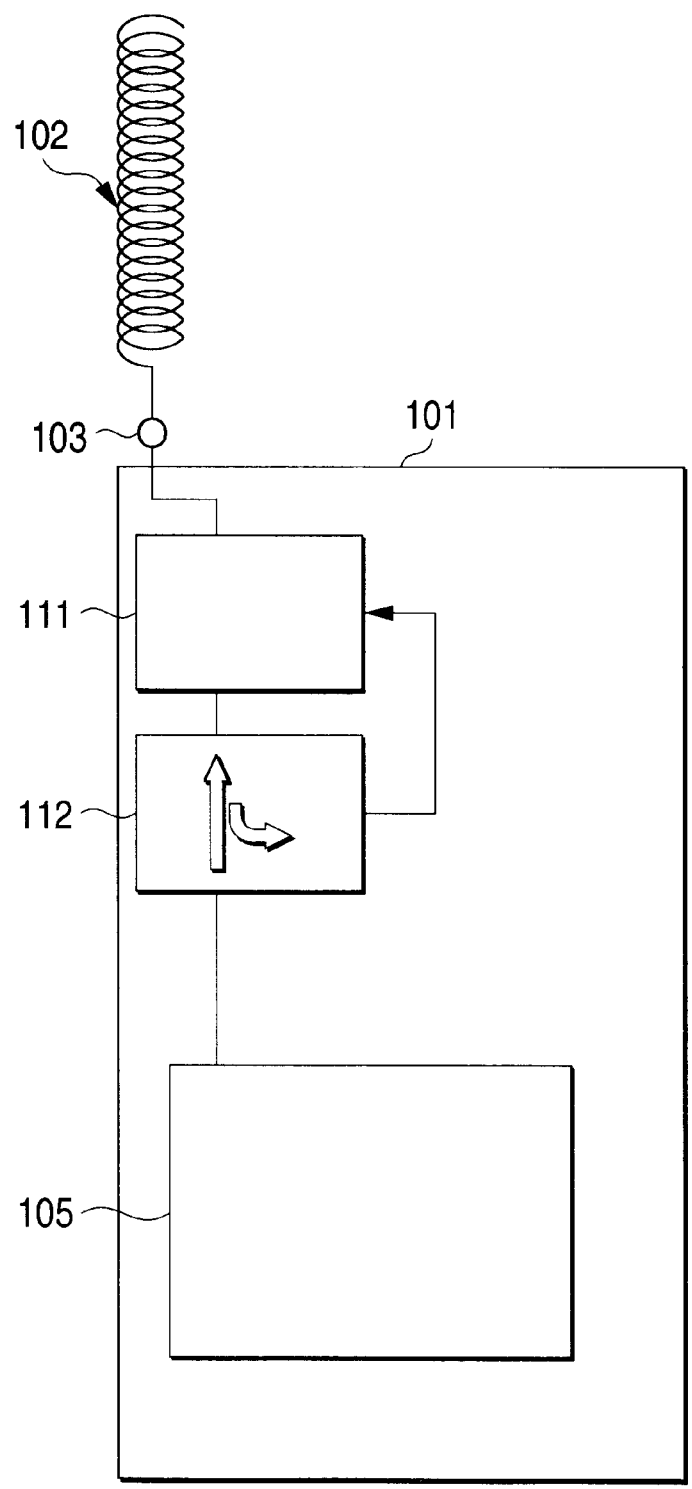
FIG. 9 is a diagram to show the configuration of an antenna apparatus according to a fifth embodiment of the invention.

FIG. 9 shows the configuration of an antenna apparatus according to a fifth embodiment of the invention. Parts identical with those previously described with reference to FIG. 1 are denoted by the same numerals in FIG. 9 and will not be discussed again in detail. The antenna apparatus of the fifth embodiment comprises a mismatch detection circuit 112 for monitoring power supplied from a radio circuit 105 to an NHA 102 and reflected because of a mismatch and a matching circuit with adjustment function 111 capable of adjusting a match characteristic, wherein the match characteristic of the matching circuit with adjustment function 111 is adjusted based on the detection result of the mismatch detection circuit 112 indicating impedance change of the NHA 102.

A combination of the matching circuit 104 and the load switch circuit 106 shown in FIG. 5, a combination of the matching circuit 104 and the variable capacitance diode 110 shown in FIG. 8, etc., can be named as the matching circuit with adjustment function 111, but the matching circuit with adjustment function 111 is not limited to the combinations. A directional coupler, etc., can be named as the mismatch detection circuit 112, and the match characteristic of the matching circuit with adjustment function 111 can be adjusted in response to the magnitude of reflected power observed with the directional coupler.

For example, if input impedance $Z_{in}$ viewed from a radio circuit 105 in a free space has conjugate match relationship with internal impedance $Z_g$ of the radio circuit 105, the mismatch detection circuit 112 detects change in the impedance of the antenna as the antenna is brought close to a human body, and the impedance condition is forcibly switched to that applied when the antenna is brought close to a human body, whereby when the antenna is brought close to a human body, the conjugate match state is also maintained and occurrence of a mismatch loss is decreased, so that the radiation efficiency of the antenna apparatus can be improved.

Further, in contrast, change in the impedance of the antenna as the antenna is brought into a free space from the proximity of a human body can also be detected and the impedance condition can also be restored to that applied when the antenna is in a free space; ideal match condition can always be selected. If the matching circuit with adjustment function 111 capable of changing the match condition stepwise like the combination of the matching circuit 104 and the variable capacitance diode 110 shown in FIG. 8 is used, the conjugate match state can also be maintained in the impedance condition when the antenna is in a free space and that when the antenna is brought close to a human body; the radiation efficiency of the antenna apparatus can always be provided stably.

As described above, according to the invention, the antenna apparatus used with a portable radio is provided with the matching circuit for conjugately matching the internal impedance of the radio circuit and the input impedance of the matching circuit to each other, whereby the mismatch loss caused by the impedance mismatch of the antenna element can be decreased. Particularly, the conjugate match characteristic is set corresponding to the state in which the antenna element is brought close to a human body, whereby the mismatch loss, the main factor when the antenna element is brought close to a human body, can be decreased and the antenna apparatus with good radiation efficiency in the use state of the portable radio installing the antenna apparatus can be provided, enabling high-quality and stable mobile communications.

What is claimed is:

1. An antenna apparatus in a portable radio apparatus comprising:

an antenna element mounted which receives electrical power from a radio circuit in the portable radio apparatus and matching in a predetermined frequency band; and a matching circuit which matches impedance of the antenna element and internal impedance of the radio circuit, wherein the matching circuit has a match characteristic to conjugately match the internal impedance of the radio circuit and input impedance from the radio circuit, to satisfy the following equations:

$Z_{in}=(\frac{1}{4}) \cdot (Z_a Z_c/(Z_a+Z_c))$;

$P_{in}=(\frac{1}{2}) \cdot Re[Z_{in} T_1 I_1^*]$;

$I_1=V_g/(Z_g+Z_{in})$;

$P_{in}=(\frac{1}{2})\cdot(|V_g|^2\cdot Re(Z_{in})/|Z_g+Z_{in}|^2)=P_{av}\cdot S$;

$P_{av}=|V_g|^2/8Re(Z_g)$; and $S=(4Re(Z_g)\cdot Re(Z_{in}))/|Z_g+Z_{in}|^2 \leq 1$, where, $Z_{in}$ represents input impedance from the radio circuit;

$Z_a$ represents impedance of the antenna element;

$Z_c$ represents impedance of the matching circuit provided in parallel with the impedance of the antenna element $Z_a$;

$Z_g$ represents internal impedance of the radio circuit;

$V_g$ represents power supply;

$P_{in}$ represents input power; and

* represents complex conjugate.

2. The antenna apparatus according to claim 1 further comprising a match characteristic controller for varying the match characteristic of the matching circuit in response to change in the impedance of the antenna element.

3. The antenna apparatus according to claim 2, wherein the match characteristic controller varies load of the matching circuit in response to change in the impedance of the antenna element to selectively accommodate at least the impedance of the antenna element when the antenna element is brought close to a human body with a sufficiently small spacing relative to the wavelength of the predetermined frequency band and the impedance of the antenna element when the antenna element is in a free space.

4. The antenna apparatus according to claim 2, wherein the match characteristic controller varies capacitance load of the matching circuit in response to change in the impedance of the antenna element.

5. The antenna apparatus according to claim 1, wherein the matching circuit includes:

a first matching circuit having a match characteristic to conjugately match the internal impedance of the radio circuit and the input impedance of the matching circuit when the portable radio is brought close to a human body with a sufficiently small spacing relative to the wavelength of the predetermined frequency band.

6. The antenna apparatus according to claim 5, wherein the matching circuit further includes:

a second matching circuit having a match characteristic to conjugately match the internal impedance of the radio circuit and the input impedance of the matching circuit in a free space; and a selector which selects the first matching circuit or the second matching circuit in response to change in the impedance of the antenna element.

7. The antenna apparatus as according to claim 2 further comprising:

a mismatch detector which monitors electric power supplied to the antenna element and reflected because of a mismatch and detecting change in the impedance of the antenna element, wherein the match characteristic controller is controlled in response to the detection result of the mismatch detector.

8. The antenna apparatus as claimed in claim 6 further comprising:

a mismatch detector which monitors electric power supplied to the antenna element and reflected because of a mismatch and detecting change in the impedance of the antenna element, wherein the selector is controlled in selection in response to the detection result of the mismatch detector.

* * * * *

UNITED STATES PATENT AND TRADEMARK OFFICE
CERTIFICATE OF CORRECTION

PATENT NO.    : 6,590,538 B1
DATED         : July 8, 2003
INVENTOR(S)   : Yoshio Koyanagi et al.

It is certified that error appears in the above-identified patent and that said Letters Patent is hereby corrected as shown below:

Column 6,
Line 35, please delete "$P_{in} = (1/2) \cdot (|V_g|^2 \cdot Re[Z'_{in}] / [Z_g + Z'_{in}|^2)$", and insert therefor -- $P_{in} = (1/2) \cdot (|V_g|^2 \cdot Re[Z_{in}'] / [Z_g + Z_{in}'|^2)$ --.

Column 8,
Line 35, please delete "$P_c$", and insert therefor -- $P_t$ --.

Column 12,
Line 66, please delete "$P_{in} = (½) \cdot Re [Z_{in}' I_1 I_1^*];$", and insert therefor -- $P_{in} = (½) \cdot Re [Z_{in} I_1 I_1^*];$ --.

Signed and Sealed this

Eighteenth Day of November, 2003

JAMES E. ROGAN
*Director of the United States Patent and Trademark Office*